United States Patent [19]

Weiss

[11] Patent Number: 4,864,468
[45] Date of Patent: Sep. 5, 1989

[54] ENCLOSURE FORMING HOUSING REAR WALL FOR RECEIVING ELECTRICAL ASSEMBLIES

[75] Inventor: Harald Weiss, Bremen, Fed. Rep. of Germany

[73] Assignee: BICC-VERO Electronics GmbH, Bremen, Fed. Rep. of Germany

[21] Appl. No.: 118,464

[22] Filed: Nov. 9, 1987

[30] Foreign Application Priority Data

Nov. 10, 1986 [DE] Fed. Rep. of Germany ....... 3638251

[51] Int. Cl.⁴ ........................... H05K 7/20; H02J 3/00
[52] U.S. Cl. .................................... 361/384; 361/391;
361/390; 307/150; 174/16.3
[58] Field of Search ................ 307/150; 361/331, 334,
361/356, 358, 383, 384, 386, 388, 392, 407, 415,
390, 394, 391; 206/328; 174/15 R, 50, 16.3;
312/7.2; 364/708

[56] References Cited

U.S. PATENT DOCUMENTS

| 3,857,044 | 12/1974 | Papoi et al. | 307/9 |
| 4,109,294 | 8/1978 | Mason et al. | 361/399 |
| 4,241,381 | 12/1980 | Cobaugh et al. | 361/413 |
| 4,365,288 | 12/1982 | Robe et al. | 363/141 |
| 4,383,286 | 5/1983 | Hicks | 361/384 |
| 4,479,198 | 10/1984 | Romano et al. | 364/708 |
| 4,530,066 | 7/1985 | Ohwaki et al. | 364/708 |
| 4,590,943 | 5/1986 | Paull et al. | 128/419 D |
| 4,658,956 | 4/1987 | Takeda et al. | 206/320 |
| 4,685,032 | 8/1987 | Blomstedt et al. | 361/412 |
| 4,731,703 | 3/1988 | Tsukaguchi et al. | 361/391 |

FOREIGN PATENT DOCUMENTS

| 0109557 | 5/1984 | European Pat. Off. . |
| 1931928 | 2/1966 | Fed. Rep. of Germany . |
| 2436586 | 2/1975 | Fed. Rep. of Germany . |
| 7613433 | 10/1976 | Fed. Rep. of Germany . |
| 7811665 | 8/1978 | Fed. Rep. of Germany . |
| 2744664 | 4/1979 | Fed. Rep. of Germany . |
| 2936499 | 3/1981 | Fed. Rep. of Germany . |
| 1503277 | 3/1978 | United Kingdom . |
| 2045006 | 10/1980 | United Kingdom . |

Primary Examiner—A. D. Pellinen
Assistant Examiner—David Osborn
Attorney, Agent, or Firm—Marshall, O'Toole, Gerstein, Murray & Bicknell

[57] ABSTRACT

A rear wall for a standard housing, which housing is adapted for receiving electronic assemblies. The rear wall is provided by an enclosure in the form of a hollow body with mounting flanges for mounting the hollow body to one end of the housing so as to form a housing rear wall. A power pack for supplying power to the electrical assemblies is mounted in the hollow body so that heat may be transferred and carried off towards the outside of the housing. Ventillators and vent openings are provided in the hollow body to enable forced ventilation cooling of the power pack as well as to enable heat transfer from the housing interior. The mounting flanges are positionally located on the hollow body so that the formed housing rear wall is provided within the housing interior and the hollow body extends from the housing rear wall outwardly so as to partially project from the housing.

16 Claims, 11 Drawing Sheets

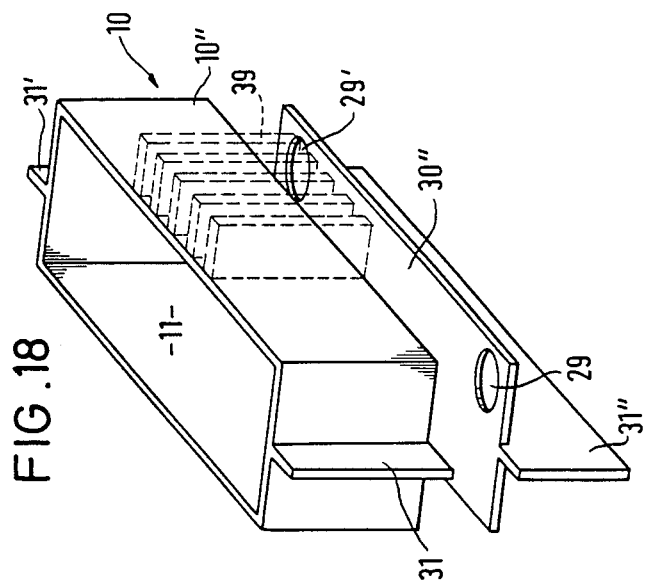
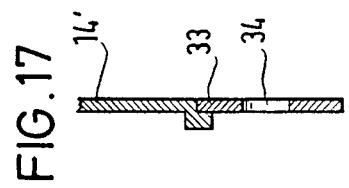
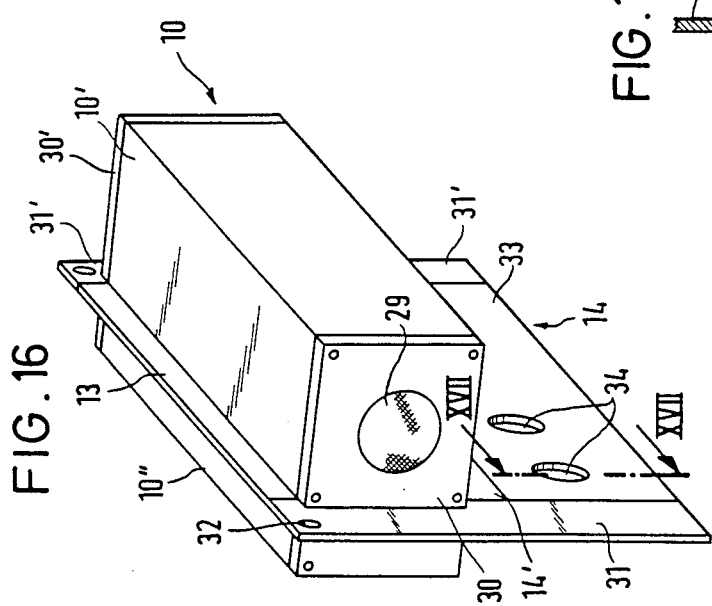

ENCLOSURE FORMING HOUSING REAR WALL FOR RECEIVING ELECTRICAL ASSEMBLIES

This relates to a housing for receiving electrical assemblies and in particular to an enclosure forming a rear wall for such a housing.

BACKGROUND OF THE INVENTION

Increasingly, housings are being used for receiving electrical or electronic structural units and assemblies, in which the individual assemblies, which are also usable for other apparatus of the manufacturer, are combined in a respectively desired manner. Standard housings are particularly suited for this, e.g., 19" assembly carriers, since, due to standardization, a plurality of assemblies of various manufacturers are combined with respect to their mechanical structure.

One assembly, which is provided in every electrical or electronic apparatus, is the power pack. This type of power pack is furnished by the manufacturers in a plurality of connecting values (output voltages, power wattage) and corresponds in its outer design to the above-mentioned standards and consequently can be used in every standard housing.

Furthermore, for the standard housing of one manufacturer, front plates or rear walls of another manufacturer can be used, since these housing measurements are standard.

Upon using power pack inserts in the housings, the problem occurs that a substantial part of the heat due to energy loss generated in the entire apparatus originates from the power pack. This heat loss, together with the heat loss of the remaining assemblies, heats up the inner space of the housing, which, on the one hand, requires special cooling measures, and on the other hand, reduces the life span of the assembly parts. Furthermore, special compensation measures have to be taken so that the temperature variations of the individual structural parts are adapted to the often rather high housing inner temperatures.

As an attempted solution of this thermal problem one sometimes provides the power pack part insert with a separate ventilator which is to carry off the heat generated by the power pack towards the rear out of the housing. In this case, a special rear wall with a ventilator unit has to be provided which renders possible the free ventilation of the power pack.

Furthermore, often a ventilator is provided for cooling the electronic assemblies (apart from the power pack) which ventilator again has to be mounted on the rear wall. If the finished apparatus is to be operated in dusty surroundings, then extensive measures have to be taken (filters, etc.), to keep the housing inner space dust-free and nevertheless to secure a sufficient heat discharge.

Finally the power pack, in particular, when it generates large output power, uses up a large part of the housing inner space which consequently no longer is available for receiving the electronic assemblies.

From Great Britain Patent No. 20 45 006 a rear wall for such a housing for electronic assemblies is known which is equipped with cooling fins and on which the semiconductors of the power pack, which generate the heat, are directly screwed on the housing rear wall. Thus the power pack is not interchangeable in different housings, so that a certain power pack (with special voltage, currents) is not always equivalent to or usable with another housing rear wall.

From German-OS Patent No. 24 36 586 a modular constructed housing has been known in which housing parts can be assembled into a unit. The housing parts are so designed that there is always a flush outer rear wall. The major advantage of this arrangement consists in that the individual structural units, which are contained in the housing modules, are protected from one another.

From German-OS Patent No. 29 36 499 a housing has been known where the power pack plug-inboard is insertible parallel to the housing rear wall similar to a mother plate. The housing rear wall itself is designed as a plane surface in the usual manner.

From German-Gm Patent No. 19 31 928 a housing has been known in which cross air ventilation is arranged in the housing, which generates, via ventilators, an air flow parallel with and along the housing rear wall, in order thus to cool the structural elements arranged in the housing interior. The rear wall itself is designed in the usual manner. Further ventilation devices for a housing have been known from German-OS Patent No. 27 44 664.

Starting with the prior art, it is an objective of the present invention to develop a rear wall for a housing in a manner that an increased variability is achieved in the electrical and thermal design of the power pack which simultaneously uses less space and has improved heat discharge without substantial cost increase.

This problem is solved by the combination of elements stated in the claims.

SUMMARY OF THE INVENTION

In accordance with one aspect of the present invention, there is provide a walled structure or enclosure comprising a hollow body which is attached to a housing for electrical assemblies to form the housing rear wall. The hollow body includes an inner space therein with a power supply pack mounted in the hollow body inner space. The hollow body is adapted to conduct heat to the outside environment. Upper and lower mounting flanges are provided on the hollow body for mounting the hollow body to the housing to form the housing rear wall. The mounting flanges may be located on the hollow body so that the hollow body partially projects from the housing. In another aspect of this invention, there is provided a hollow body housing rear wall which includes a power supply pack mounted in the hollow body inner space, and forced air ventilation means for ventilating heat from the power pack to the outside environment. Upper and lower flanges are provided on the hollow body for mounting the hollow body to the housing to form the housing rear wall.

According to this invention the power pack is placed into the hollow body inner space rather than in the housing inner space, which enables the normal power pack location in the housing inner space to be available for receiving electronic assemblies. Simultaneously, a kind of "two-chamber system" is created according to the principles of this invention, since the housing inner space is only burdened with the discharge heat of the electronic assemblies, while the discharge heat of the power pack is directly carried off in the hollow body at the rear wall. Another essential advantage of this invention consists in that all assemblies, which have to be supplied with power, get their power supply from the rear anyway, that is from the direction of the rear wall which up to the present could only be achieved via a corresponding wiring system. Since the power pack is now located at the rear of the assemblies, the wiring can be done in the shortest manner which reduces the transmission of voltage fluctuations in the power supply from one assembly to another assembly.

When the electronic assemblies in the housing interior do not generate too much waste heat, which usually is the case, then the housing inner space can be hermetically sealed by the rear wall according to this invention, since then the heat discharge from the housing interior is accomplished via the bottom and cover plates of the housing, while the (greater) heat discharge of the power pack takes place via the rear wall.

If one, as preferred, designs the hollow body for receiving the power pack over the entire housing width then a very large area for heat discharge is available. The result is that substantially stronger designed power packs can do without forced ventilation, as is the case with power pack inserts.

If one provides forced ventilation, according to an alternate embodiment of the invention, then the ventilation can be carried out over the entire housing width, which is particularly simple with respect to the current flow conduit and is particularly advantageous with respect to the heat dissipation. This advantage becomes especially obvious when one considers forced ventilation cooled power pack inserts. A further substantial advantage of this cross ventilation is that, upon mounting several apparatus which are equipped in this manner, in a standard cabinet, the heat dissipation of the total apparatus is considerably simpler than previously. Up to now the apparatus generating the most heat (and also the heaviest apparatus because of the corresponding transformers) had to be mounted high up in the cabinet which not only worsens the stability of the cabinet, but also often brings about an undesirable arrangement of the apparatus in the cabinet.

If forced ventilation of the power pack is provided over the entire housing width, then ventilation of the housing inner space can also be provided by branching off a part of the air flow and dimensioning the vents accordingly. If an absolutely dust-free inner space of the housing is desired according to another embodiment of this invention there is provided a heat exchanger in the hollow body, which discharges the heat from the air volume of the housing inner space via correspondingly enlarged transition areas to the outer air.

With respect to the above-mentioned advantages regarding the supply lines from the power pack to the assemblies, it is particularly advantageous when a power bus bar is provided, for example, at or in the hollow body respectively, which runs via the entire housing width. These bus bar types have been known from German design Pat. Nos. 76 13 433 and 78 11 665. This power bus bar system, which, of course, has a plurality of individual bus bars with regular tapping points towards the housing inner space, can be connected, over relatively short transmission paths, with the assemblies located in the housing inner space. In the hollow body itself, various power packs for the various voltages can be provided, which feed their power outputs into the power bus bar. A separate wiring thus is unnecessary.

A particularly preferred embodiment is one where the hollow body is designed as an extrusion profile, since this brings about a plurality of advantages with respect to stability, reworking, etc.

BRIEF DESCRIPTION OF THE DRAWINGS

Further preferred embodiments result from the subclaims and the subsequent examples of the embodiments which are explained in detail by means of the illustrations. The various figures show the following:

FIG. 16 shows a perspective view of a hollow body rear wall in a further preferred form of the embodiment, FIG. 17 shows a partial longitudinal section through the hollow body according to FIG. 16 along the line XVII—XVII, FIG. 18 shows a hollow body housing rear wall in another preferred form of the embodiment of this invention in a perspective view;

DETAILED DESCRIPTION

Figure 1:
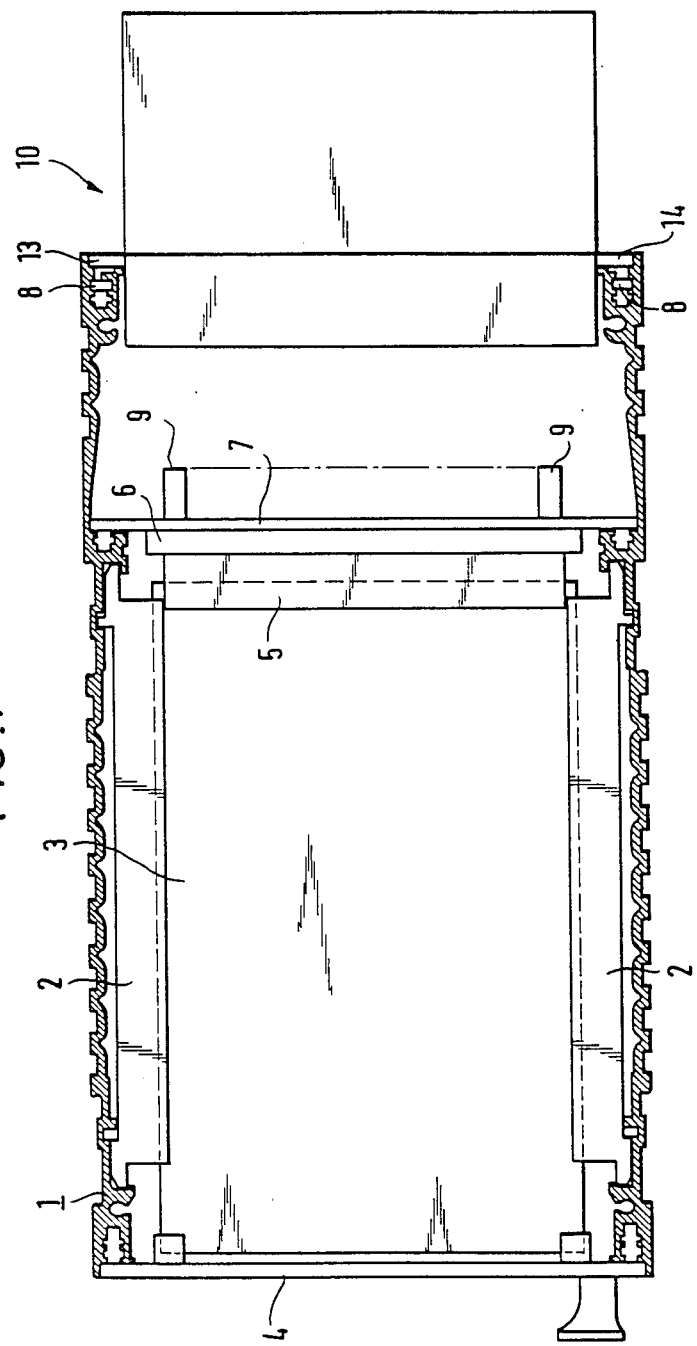
FIG. 1 shows a longitudinal section through the length of a housing electrical units, the housing having a rear wall formed of a hollow body (not in section)
Figure 2:
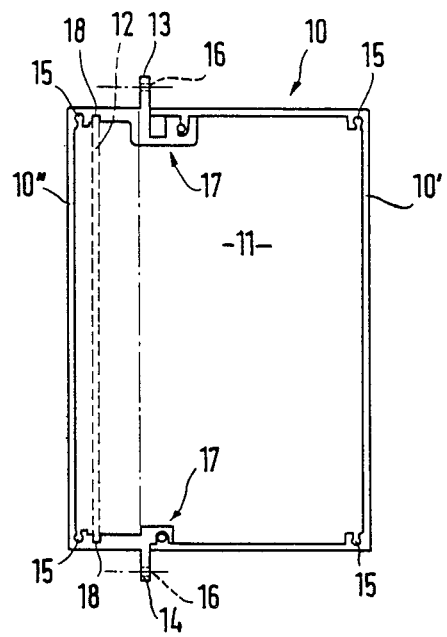
FIGS. 2 to 13 show cross-sections through respective hollow body rear walls for housing for electrical units according to various preferred forms of embodiments.

FIG. 1 shows schematically a 19" assembly carrier housing 1 at the upper and lower wall of which the usual guide rails 2 are used. The guide rails 2 serve to receive assemblies 3, for example, European cards or modules, which, at their front side, are provided with front plates 4 and handles for pulling-out and inserting the assemblies.

At the housing rear, assemblies 3 with soldered-on contact strips 5 are provided, which, upon insertion of the assembly 3 into the housing 1, fit in spring contact strips 6. The spring contact strips 6 are soldered onto a mother plate 7, which connects the spring contact strips 6 for various assemblies 3 in the housing 1 in the desired manner with one another and, if necessary, also carries additional assemblies. A portion of the contact lugs 9 extend outwardly through the corresponding bores in the mother plate 7 in the direction of the, housing rear wall. Of course, not only a mother plate 7 can serve for connecting the spring contact strips 6 or the assemblies 3 respectively with each other, as conventional wiring may be used, in which case the spring contact strips 6 are directly mounted on the housing 1.

At the rear end of the housing 1, slots are provided above and below, in which pre-drilled topped strips 8, which are provided with threads, are inserted. The screw strips 8 serve to mount a rear wall onto the housing 1.

According to this invention, the rear wall is formed of a walled structure or enclosure in the form of a hollow body 10, which contains the power pack for the apparatus. The hollow body 10 is equipped with an upper flange 13 and a lower flange 14 which carries bores corresponding to the thread bores in the screw strip 8, in order to solidly screw the hollow body to the housing 1.

The flanges 13 and 14 are located, in this preferred form of the embodiment shown here, not entirely at the end of the hollow body 10, but are so arranged that a portion of the hollow body 10 projects into the inner space of the housing 1, and the remaining portion projects toward the rear out of the housing 1. Due to this form of the embodiment of this invention a particularly efficient heat discharge is obtained by mere convection ventilation, since not only the rear area of the hollow body 10, together with the power pack located therein, are exposed to the surrounding air, but also a large part of the upper and lower side of the hollow body 10. Furthermore this form of the embodiment guaranties that the hollow body 10 obtains a relatively large inner volume without projecting too far from the housing 1 towards the rear.

In the following, various preferred forms of the embodiment of the hollow body are described in detail in conjunction with FIGS. 2 to 13, which all are fabricated as extrusion profiles which bring about a particularly stable structure and yet relatively small manufacturing costs.

All shown forms of the embodiment of a hollow body in accordance with this invention have the common features that continuous slots 15 are provided which serve as receiver bores for self-tapping screws for the mounting of the side covers. Furthermore, all shown forms of the embodiment have slots 18 into which power packs 12 or their plates respectively are insertible so that the power packs are kept securely in the inner space 11 of the hollow body 10.

In the forms of the embodiment of this invention shown in FIGS. 2, 3, 5, 7, 9 to 11 and 13 the hollow body 10 consists of a base part 10'', which, at its upper side and its underside, along the entire length, carries flanges 13 or 14 respectively, in which bores 16 are located in order to fasten the base part 10'' to the housing. A lid 10' is mounted on the base part 10'', with the lid being able to be connected by means of fastening means 17 with the base part 10''.

The lid 10' can be designed as a hood (FIGS. 2, 5, 9 to 11, 13) which, depending on the space requirement and required access to the inner space 11, can have larger or smaller dimensions.

Figure 3:
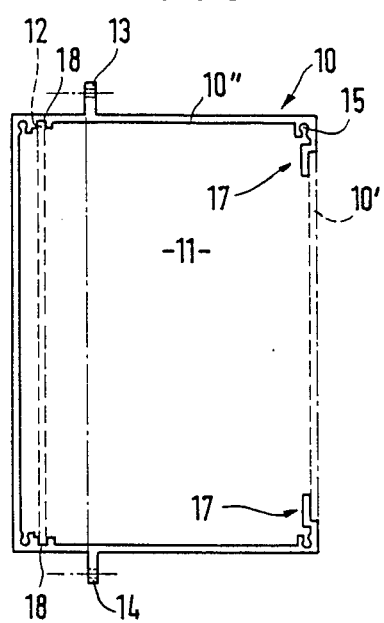
Figure 7:
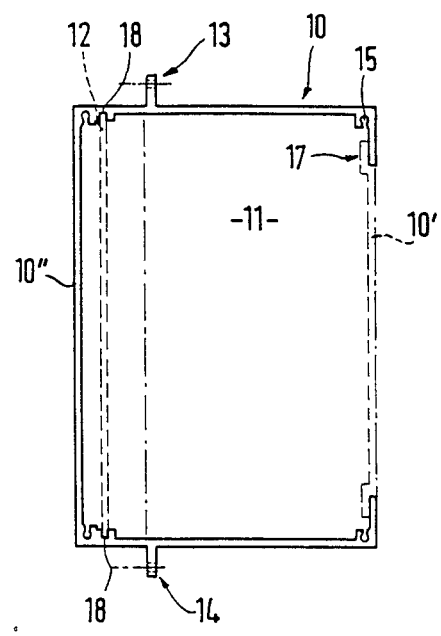

In another preferred form of the embodiment the lid 10' is merely designed as a ribbon-shaped plate (FIG. 3, FIG. 7).

Figure 4:
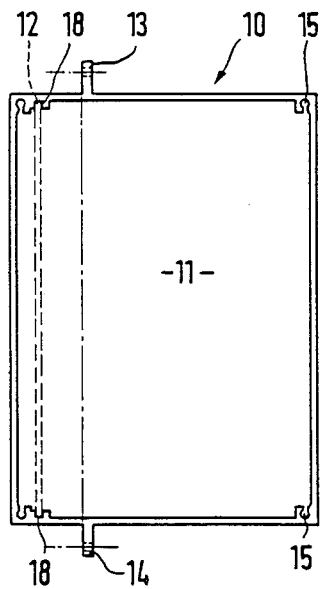
Figure 5:
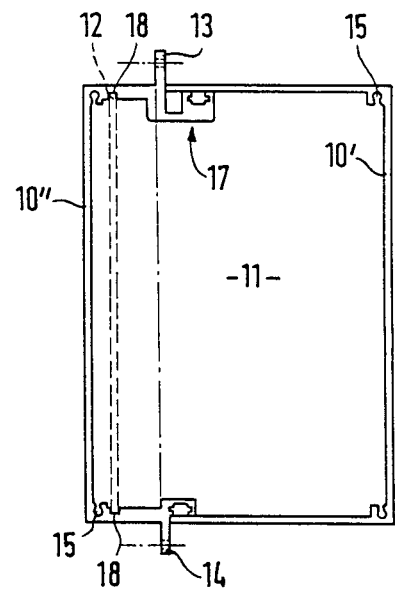

In the form of embodiment shown in FIG. 4 the hollow body 10 is designed as a unitary member which may lower the mounting expenses.

Figure 6:
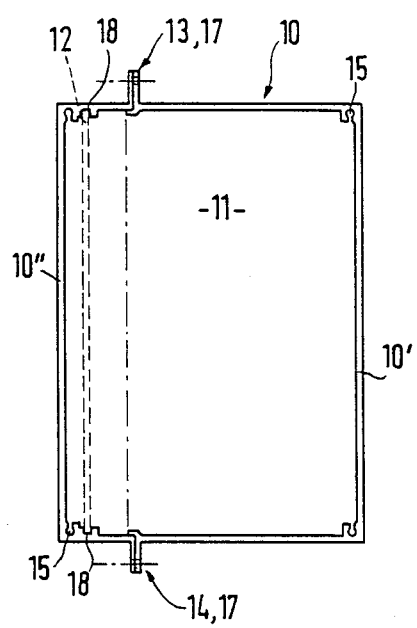

In FIG. 6, a form of the embodiment is shown in which both halves of the hollow body 10 are connected via the flanges 13 and 14, or respectively via the correspondingly inserted screws.

Figure 8:
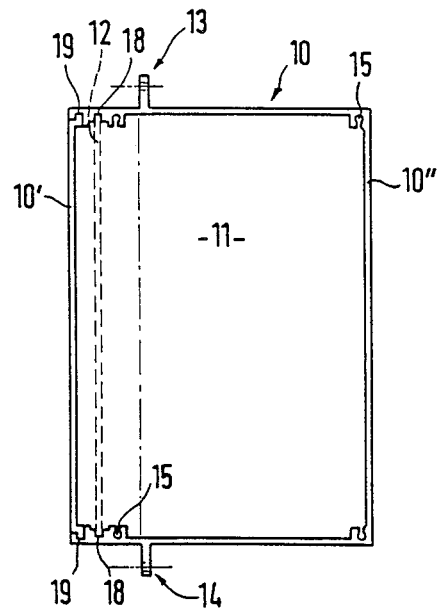
Figure 9:
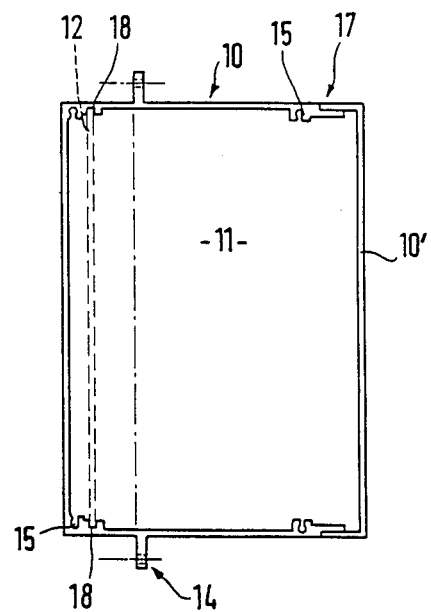
Figure 10:
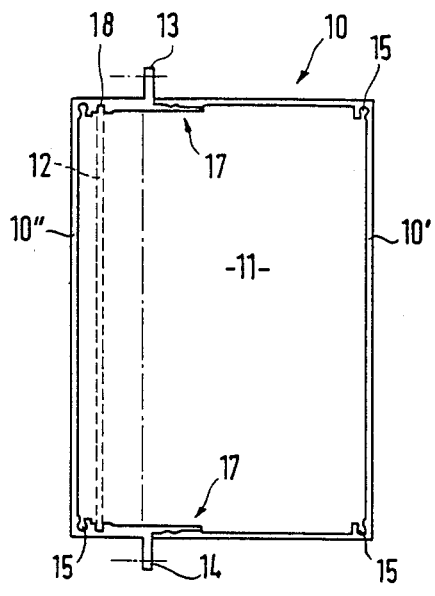
Figure 11:
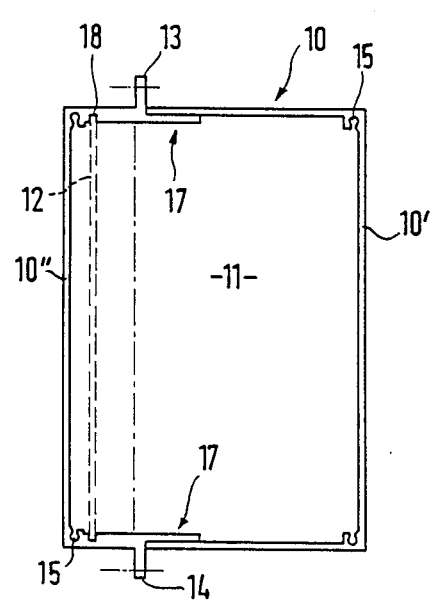
Figure 12:
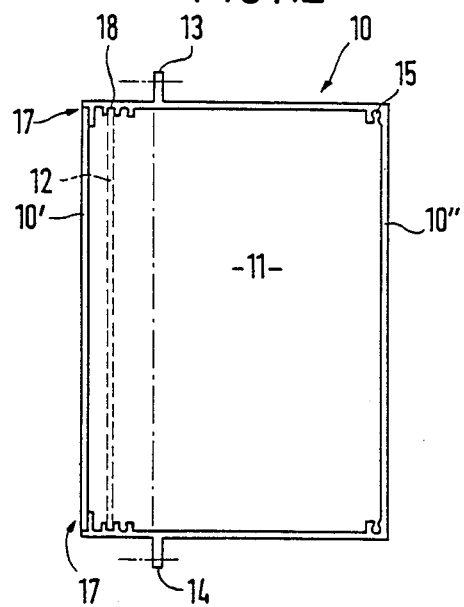

In the form of the embodiment of this invention shown in FIGS. 8 and 12, the lid 10' is designed on the housing inner side of the hollow body 10 wherein the form of embodiment according to FIG. 8 has slots 19 for fastening the lid 10' to the base section 10''.

Figure 13:
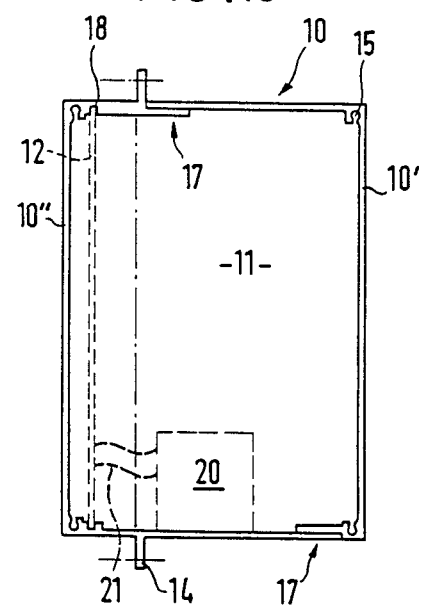

As will be obvious from FIG. 13, the design of the hollow body 10 mainly depends on the structure of the power pack 12, since, for example (FIG. 13), one can fasten a construction element 20, which generates particularly high waste heat, at the base section 10''.

Figure 14:
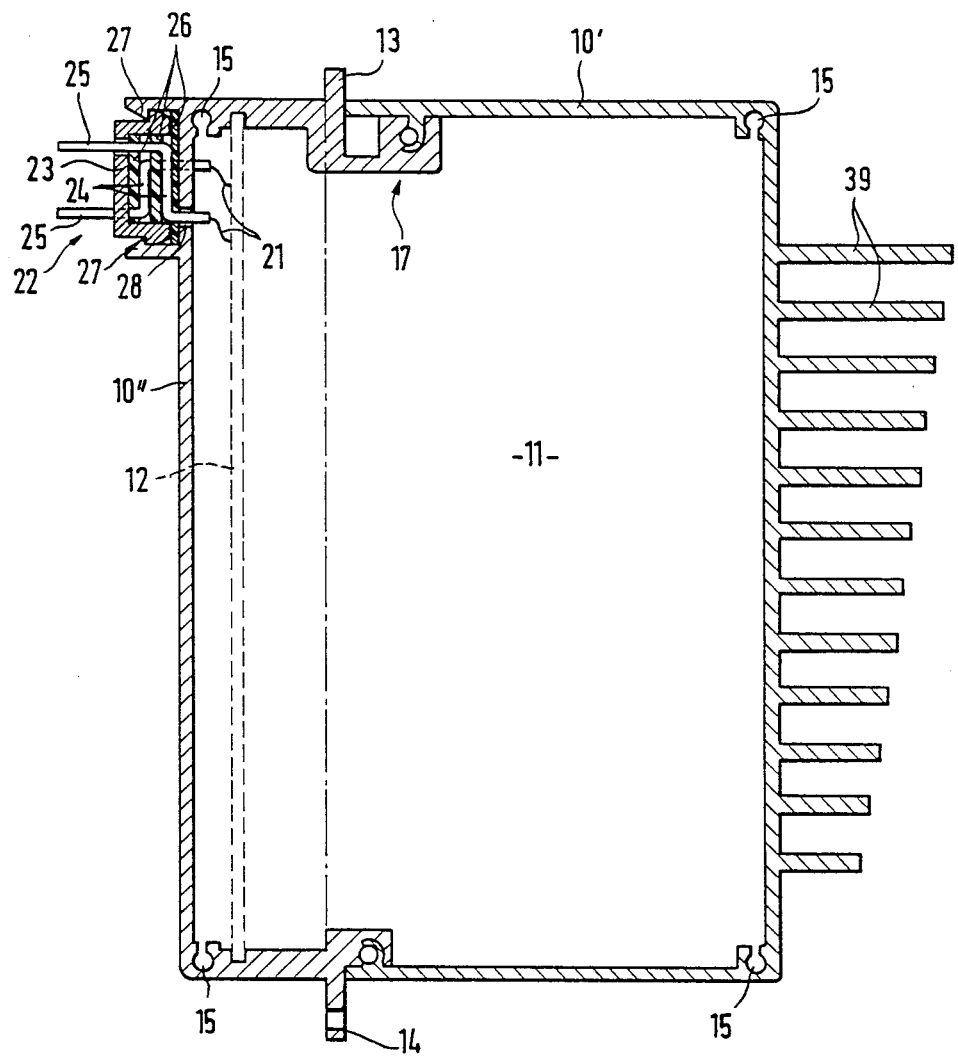
FIG. 14 shows a cross-section through a hollow body housing rear wall in a preferred form of the embodiment with power bus bar and cooling fins.

If one provides pure convection cooling, then, for carrying off larger heat amounts one can provide a plurality of cooling fins 39 at the hollow body 10, for example, at the lid 10', as this is shown in FIG. 14. In order to compensate for the unfavorable arrangement of the cooling fins 39 with respect to convection which is due to the extrusion profile fabrication, it is of advantage that the individual cooling fins 39 increase in length upwardly from below.

The described hollow body with a continuous cross-section preferably runs over the entire housing width. Here it is especially advantageous—as shown in FIG. 14—if, in the hollow body 10 or its base section 10'' respectively, a power bus bar 22 is provided. This power bus bar consists of several (in FIG. 14 only two are shown) conducting rails 24, which carry, at regular intervals, bent connecting clamps 25 which project in the direction of the housing inner space. The conducting rails 24 are kept at a defined distance from one another by insulating layers 26 so as to form defined values of capacitomer or inductances respectively. Furthermore, the conducting rails 24 are led, by correspondingly bent connecting clamps, into the inner space 11, whereby these connecting clamps are led through transit openings 28 into the inner space 11. There they are connected with the corresponding connecting points to the power pack 12 by connecting leads 21.

The arrangement consisting of conducting rails 24 with insulating layers 26 in between is held by a rail-type lid 23 at the hollow body 10 or at the base section 10'' respectively, by means of retaining hooks 27, which also are formed together with the extrusion profile.

By means of this arrangement a plurality of particularly significant advantages is guaranteed. First, each assembly 3 arranged in the housing 1 can be supplied with power in the shortest manner; secondly, the power pack 12 can consist of separate assemblies, which are composed depending on the wishes of the user (various voltages, various output currents). The feeding of the supply currents from the power packs takes place first into the power bus bar 22, whereby the spatial arrangement of the respective power bus bar 22 to the respective assembly 3. Furthermore, this arrangement of the power bus bars guarantees a certain disengagement of the individual assemblies 3 from one another. If one uses conventional wiring (paired with an insert-power pack), then the jump in the power consumption of an individual assembly leads to an interference impulse in the power supply line which is communicated to the other assemblies and has to be filtered out there by special measures, such as with filters having a large capacitance. This interference is almost completely eliminated with power bus bar 22. Furthermore, the conducting rails 24, in contrast to the usual wiring, may be generously dimensioned so that a voltage drop or a heatingup can be avoided. This is particularly of advantage when large amounts of power are consumed.

Figure 15:
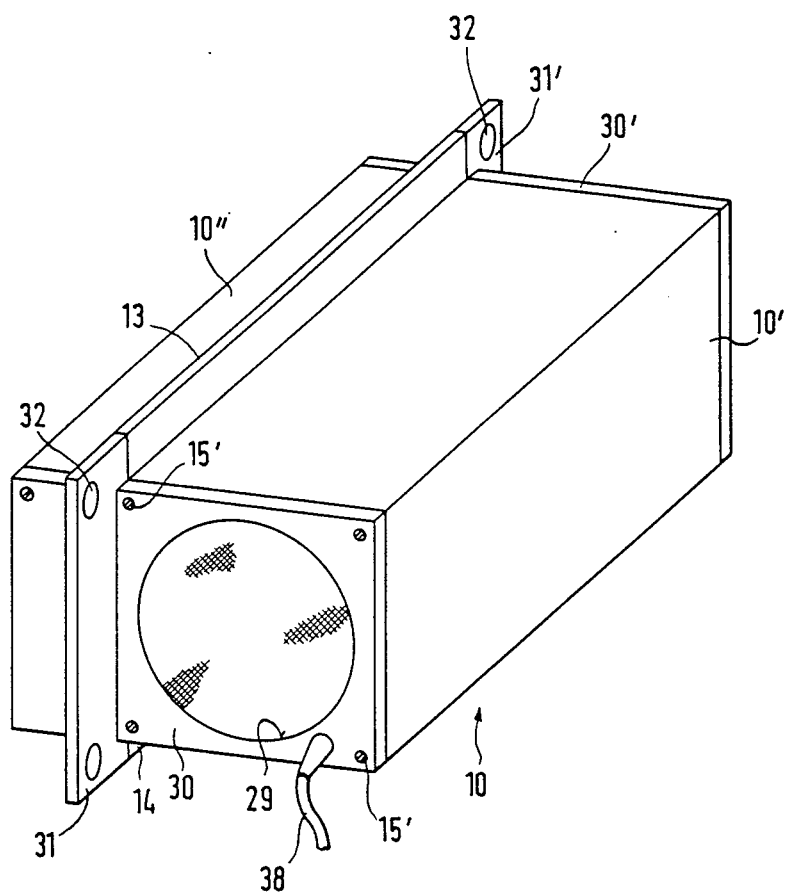
FIG. 15 shows a perspective view of a hollow body housing rear wall according to another preferred form of the embodiment.

FIG. 15 shows further details of the invention under discussion. We see in this figure that the hollow body 10 which extends over the entire width of the housing, is closed off at its sides with side sections 30, 30', which, in the form of the embodiment of this invention shown here, have flanges 31, 31' with fastening bores 32. These side flanges 31, 31' are not absolutely necessary, but are advantageous, if the housing 1 is to be sealed off against dust.

FIG. 15 shows another advantage of the invention under discussion which consists in that a cross ventilation of the inner space 11 of the hollow body 10 can take place. For this, the two side sections 30, 30' have ventilation openings 29, whereby at least the suction opening preferably is provided with a protective grid and a filter. By means of this cross ventilation the entire inner space of the hollow body 10 is ventilated in the simplest and most efficient manner. Note in the embodiment of FIG. 15 that air is sucked in from the outside (that is, not with the heated air from the apparatus inner space), without any particular means being provided for guiding the air flow, as is the case with insert power packs, which on their rear side have to suck in as well as discharge the air.

From FIG. 15 it can be seen that the power supply, which usually operates with alternating current, can be supplied by means of a power cable 38, which directly ends in the power pack. In this manner a considerable decrease in humming interferences is achieved which otherwise are almost unavoidable due to stray capacitances and inductances.

The side sections 30, 30' can be fastened by means of self-tapping screws 15' which are screwed in the openings 15 (see FIGS. 2 to 13).

In the variation shown in FIG. 16, which is designed similar to that of FIG. 15, one of the flanges 14 is wider (or higher) than the other flange 13. The illustrated lower flange 14 consists of a section 14', which is formed in one piece with the hollow body 10', and a removable plate 33, which serves to mount the plug sockets. In order to facilitate the boring of the mounting bores 34 in the plug socket mounting plate 33 by the user, the mounting plate 33 is made completely flat and can be removably fastened by means of screws (not shown) to the flange section 14'. The plate 33 is fastened to the housing 1 at the lower edge.

In all forms of the embodiment shown up to now, the extrusion profile is designed crosswise to the housing. In contrast to this, in the following form of the embodiment of this invention shown in FIG. 18, the extrusion profile is designed vertically, that is, the "disks" to be sliced off from the semi-finished material correspond in their length to the height of the housing or the rear wall respectively. Instead of the side sections 30, 30' the hollow body is closed also by extrusion form pieces 30'', which also may have vent openings 29, 29'. Here too, a cross-ventilation takes place, whereby the air intake and air exhaust take place in the vertical direction.

Furthermore the flange 31'' of the lower (or upper) form section 30'' can be broader so that mounting bores 34 for plug sockets can be provided.

If one does not want to provide forced air ventilation, then one can mount cooling fins 39, which improve the heat discharge, on the hollow body 10, as in all other previously described forms of the embodiment. In the preferred form of the embodiment shown in FIG. 18, these cooling fins 39 run, due to the other "extrusion direction", in the (vertical) direction which is favorable from the flow-technical point of view.

Figure 19:
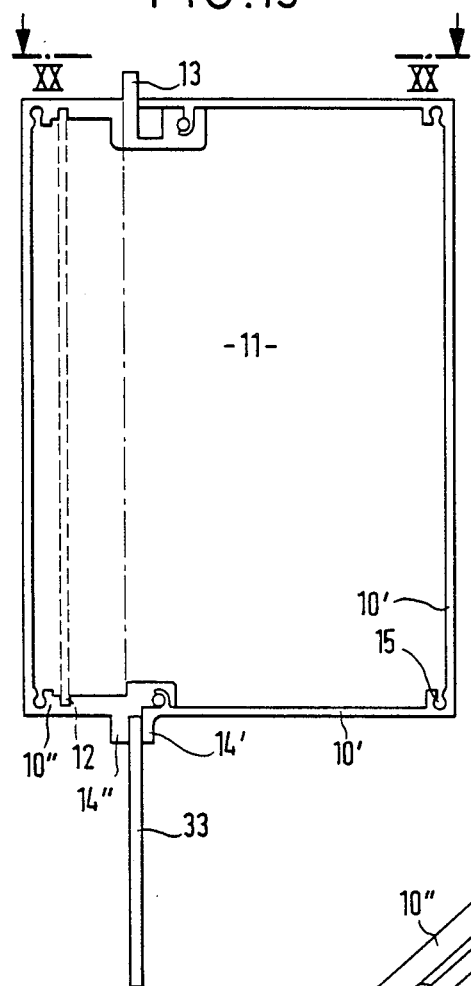
FIG. 19 shows a longitudinal section through a hollow body housing rear wall in a further preferred form of this invention.
Figure 20:
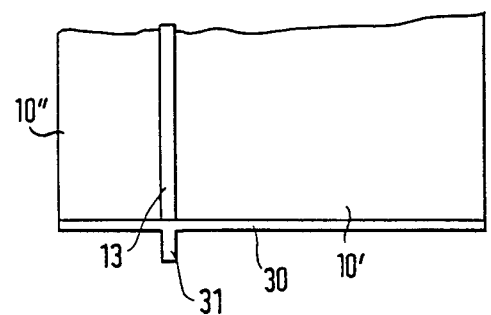
FIG. 20 shows a view of the hollow body rear wall according to FIG. 19 along the line XX—XX.
Figure 21:
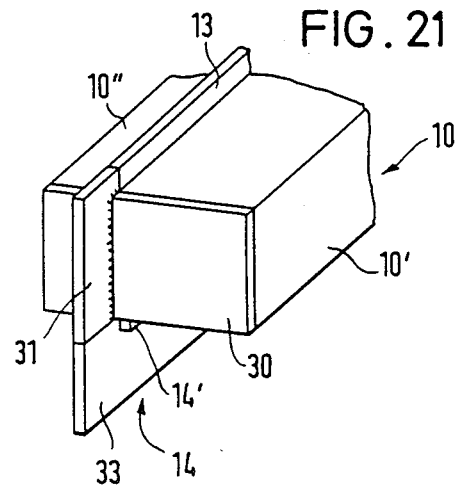
FIG. 21 shows a perspective partial view of the hollow body rear wall according to FIGS. 19 and 20.

In FIGS. 19 to 21 another preferred variation of this invention is shown similar to the one shown in FIGS. 16 and 17. In this form of the embodiment, the base section 10'' is equipped with a shorter flange 14'' and similarly the lid section 10' is equipped with a flange 14', wherein the dimensioning is so that between the two flanges 14' and 14'' a defined distance is maintained. The above-described plug socket mounting plate is inserted into the intermediate space, which only at its underside has to be connected to the housing 1. The stability of the arrangement is sufficient, because the hollow body 10 or its side sections 30 respectively are provided with side flanges 31.

From FIG. 21 we see furthermore that the side sections 30 also preferably are fabricated as extrusion profiles, whereby only little material waste is generated.

Figure 22:
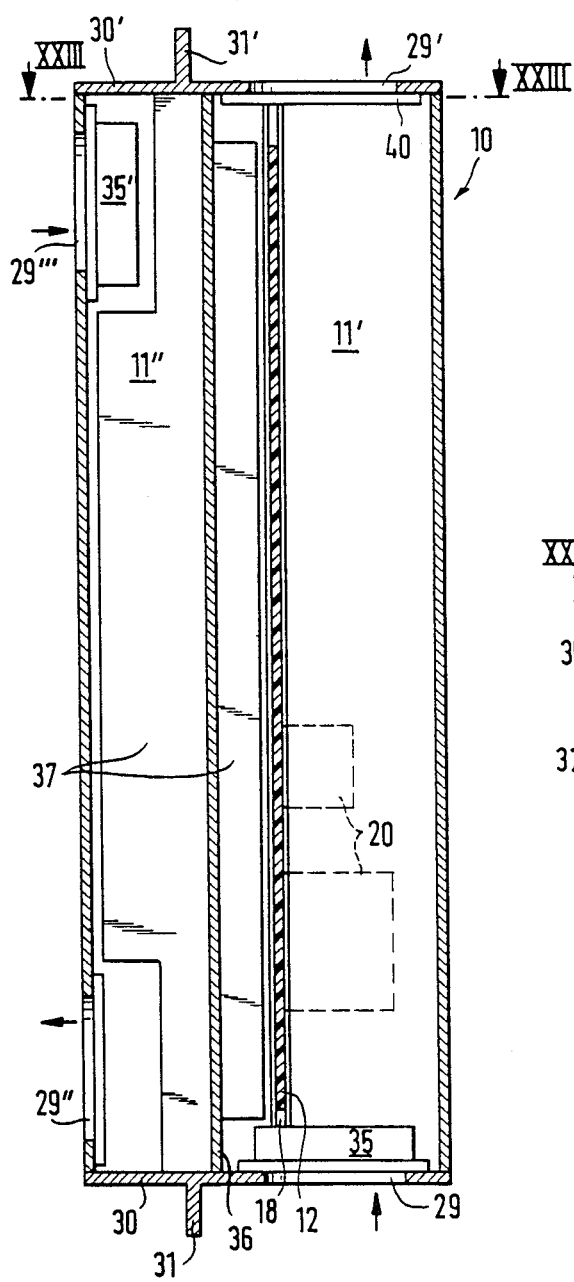
FIG. 22 shows a horizontal section through a hollow body housing rear wall in another preferred form of the embodiment of this invention along the line XXII—XXII of FIG. 23.
Figure 23:
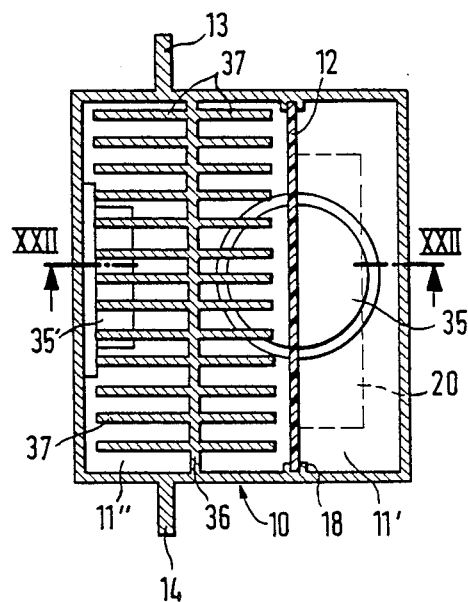
FIG. 23 shows a section along the line XXIII—XXIII from FIG. 22 (longitudinal section)

In another preferred form of the embodiment of this invention shown in FIGS. 22 and 23, the hollow body 10 not only contains the power pack 12, but also a heat exchanger for cooling the inner space of the housing. For this purpose, the inner space of the hollow body 10 is separated by a partition wall 36 into two separate sections of space 11' and 11'', whereby the section of space 11' (projecting away from the housing) contains the power pack 12. The ventilation takes place by means of an axial ventilator 35 and that is, in such a manner, that the air for cooling the power pack 12 is first sucked in through the vent opening 29 and is led over the entire width of the hollow body 10 to the outlet opening 29' (with protective grid 40). Thus the structural units 20 of the power pack 12 lie directly in the path of the air flow. A portion of the air supplied by the ventilator 35 passes the rear side of the plate of the power pack 12 and also leaves the hollow body 10 at the opening 29'. At the same time this air brushes the cooling ribs 37 and the partition wall 36 and removes heat from them. On the other hand, by means of a rear ventilator 35', air is sucked in from the inner space of the housing 1 via an inlet opening 29''' into the space section 11'' and returned on the opposite side through an opening 29'' into the housing inner space. Cooling ribs 37 also project into the space section 11'', said cooling ribs being connected to the partition wall 36. By this air flow, an efficient heat exchange between the air from ventilator 35' and that of ventilator 35 is secured (counterflow) so that the inner space of the housing 1, even when it still contains many heat generating structural units or assemblies which necessitate forced air cooling, can be sealed off hermetically and thereby rendered dust-free.

In another form of the preferred embodiment of this invention, not shown here, which is of advantage where the requirement for a dust-free housing inner space is less strict, one may omit the partition wall 36 with cooling fins 37, as well as, if necessary, the second ventilator 35' so that one part of the air fed by ventilator 35 flows through the housing inner space, with the other part flowing over the power pack 12.

Figure 24:
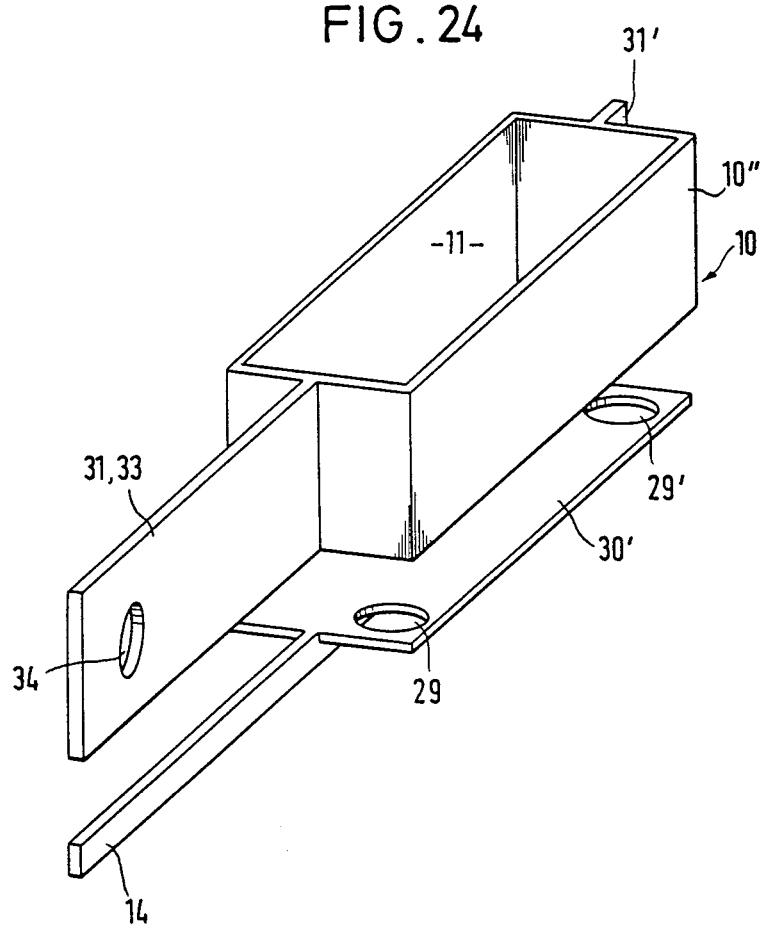
FIG. 24 shows a perspective view of a hollow body housing rear wall in another preferred form of the embodiment of this invention.

In the variation shown in FIG. 24, which is similar to FIG. 18, the one side flange 31 is lengthened so that a mounting plate 33 for the bores 34 for the mounting of plug sockets is created. The mounting of a power bus bar still is easily possible, if one integrates its clamping fixture, for example, into the form piece 30'.

Figure 25:
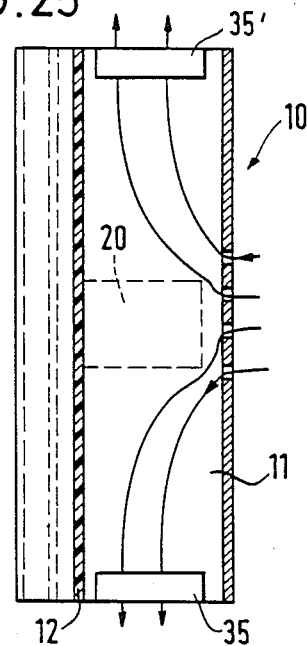
FIGS. 25 and 26 show a hollow body housing rear wall in two further preferred forms of the embodiment of this invention in a longitudinal and cross-sectional section respectively.

In FIG. 25, another preferred form of the embodiment of this invention is shown in a longitudinal section. This form of the embodiment is particularly suited, if high, upright structural units 20 are arranged on the plate 12, which would hinder the free passage of the air flow in a purely cross flow ventilation. In this form of the embodiment of the invention two ventilators 35, 35' are provided, which suck the air out of the inner space 11, whereby this air flows in via inlet apertures (if necessary, with filters in front of them) and thus directly cools the high upright structural units. Of course, these inlet openings must not be located in the center, but are preferably so provided that efficient cooling over the entire inner space 11 is secured.

Figure 26:
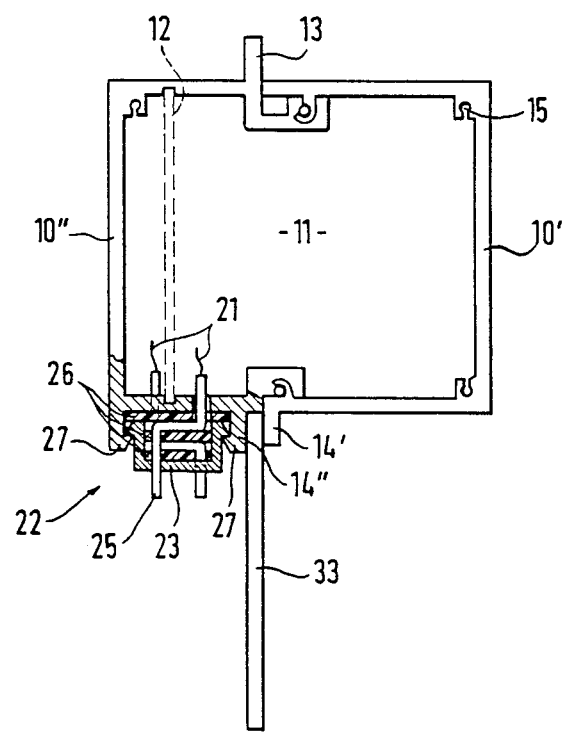

The form of the embodiment shown in FIG. 26 is similar to FIG. 19 with respect to the housing cross-section and similar to FIG. 14 regarding the arrangement of a power bus bar. In this case, however, the power bus bar 22 is so arranged that its one retaining hook 27 simultaneously forms the lower mounting flange 14", which, together with the second lower mounting flange 14' supports the plug socket mounting plate 33. Furthermore in this arrangement the connecting clamps 25 project downwardly, that is not into the inner space of the apparatus, which saves space. Otherwise, the power bus bar 22 is designed as the one described in connection with FIG. 14.

Naturally, all random combinations of the forms of embodiments shown here are possible without leaving the scope of this invention. The foregoing detailed description has been given for clearness of understandingly only, and no unnecessary limitations should be understood therefrom, as modifications will be obvious to those skilled in the art.

What is claimed is:

1. For use with a housing (1) adapted for receiving electrical assemblies (3) between opposite housing side walls and a power pack (12) for supplying power to said electrical assemblies, an enclosure forming a rear wall for said housing (1), said enclosure comprising:
    a hollow body (10) including an inner space (11) therein;
    said hollow body (10) being provided, at least over one portion of the housing width, with a bus bar (22), including connecting clamps (25), the connecting clamps (25) projecting into the housing (1) at regular intervals and being connected with the power pack (12), wherein the connecting clamps (25) are connected by mutual conductor rails (24), wherein several conductor rails (24), spaced by insulating layers (26), are provided stacked up flat adjacent one another to form a defined capacitance and inductance;
    means (18) for mounting said power pack in said hollow body inner space (11) to enable heat to be carried off towards the outside of said housing (1); and
    mounting means (13, 14) for mounting said hollow body housing (1), including an upper and a lower mounting flange (13, 14) located on said hollow body (10) so that the hollow body (10) at least partially projects from the housing (1).

2. For use with a housing (1) adapted for receiving electrical assemblies (3) between opposite housing side walls, an enclosure forming a rear wall for said housing (1), said enclosure comprising:
    a hollow body (10) adapted for conducting heat and including a hollow body walls defining an inner space (11) therein;
    a power pack (12) for supplying power to said electrical assemblies (3), including means (18) for mounting said power pack in said hollow body inner space (11) to enable heat to be carried off towards the outside of said housing (1);
    ventilating means in said hollow body (10) including air intake and air outlet vent openings (29, 29', 29", 29'") in at least two of said hollow body walls and at least one ventilator (35, 35') operatively mounted atone of said vent openings and within said inner space (11) for forced ventilation of said hollow body inner space (11); and
    mounting means for mounting said hollow body (10) on one end of said housing (1) to form a rear wall for said housing (1), including an upper and a lower mounting flange (13, 14) on said hollow body (10).

3. For use with a housing (1) adapted for receiving electrical assemblies (3) in the housing interior and between opposite housing side walls, an enclosure forming a rear wall for said housing (1), said enclosure comprising:
    a hollow body (10) including hollow body walls defining an inner space (11) therein;
    a power pack (12) for supplying power to said electrical assemblies (3);
    means (18) for mounting said power pack in said hollow body inner space (11) to enable heat to be carried off toward the outside of said housing (1);
    mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1).

4. An enclosure according to claim 3, wherein at least one mounting flange (13, 14, 31, 31') comprises a wide plate for the mounting of connector sockets.

5. In a housing (1) adapted for receiving electrical assemblies (3), the improvement comprising an enclosure forming a rear wall for said housing, said enclosure including:
    a hollow body (10) adapted for conducting heat and including hollow body walls defining an inner space (11) therein;
    a power pack (12) for supplying power to said electrical assemblies (3), including means (18) for mounting said power pack in said hollow body inner space (11) to enable heat to be carried off towards the outside of said housing (1);
    ventilating means in said hollow body (10) including air intake and air outlet vent openings (29, 29', 29", 29'") in at least two of said hollow body walls and at least one ventilator (35, 35') operatively mounted at one of said vent openings and within said inner space (11) for forced ventilation of said hollow body inner space (11); and
    mounting means for mounting said hollow body (10) on one end of said housing (1) to form a rear wall for said housing (1), including an upper and a lower mounting flange (13, 14) on said hollow body (10).

6. In a housing (1) adapted for receiving electrical assemblies (3) in the housing interior and between opposite housing side walls, the improvement comprising an enclosure forming a rear wall for said housing, said enclosure including:
- a hollow body (10) including hollow body walls defining an inner space (11) therein;
- a power pack (12) for supplying power to said electrical assemblies (3);
- means (18) for mounting said power pack in said hollow body inner space (11) to enable heat to be carried off towards the outside of said housing (1);
- mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1).

7. For use with a housing (1) adapted for receiving electrical assemblies (3) in the housing interior and between opposite housing side walls, an enclosure forming a rear wall for said housing (1), said enclosure comprising:
- a hollow body (10) including hollow body walls defining an inner space (11) therein;
- a power pack (12) for supplying power to said electrical assemblies (3);
- means (18) for mounting said power pack in said hollow body inner space (11) to enable heat to be carried off towards the outside of said housing (1);
- mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1);
- said hollow body (10) including ventilators (35) and vent openings (29 to 29''') for forced ventilation cooling of the power pack (12) in the hollow body inner space (11), said vent openings (29, 29', 29'', 29''') being located in the hollow body (10) to enable ventilation of the inner space (11) to take place over the entire width of the hollow body (10).

8. An enclosure according to claim 7, wherein the hollow body (10) extends over the entire width of the housing (1).

9. An enclosure according to claim 7, wherein the hollow body walls of the hollow body (10) are formed of two portions, including a base (10'') and a removable lid (10'), with the removable lid extending coextensively with the base.

10. An enclosure according to claim 7, wherein two of the hollow body walls of the hollow body (10) are formed by side sections (30, 30').

11. An enclosure according to claim 10, wherein the side sections (30, 30') include mounting flanges (31, 31') for mounting said hollow body to the housing (1).

12. For use with a housing (1) adapted for receiving electrical assemblies (3) in the housing interior and between opposite housing side walls, an enclosure forming a rear wall for said housing (1), said enclosure comprising:
- a hollow body (10) including hollow body walls defining an inner space (11) therein;
- a power pack (12) for supplying power to said electrical assemblies (3);
- means (18) for mounting said power pack in said hollow body inner space (11) to enable heat to be carried off towards the outside of said housing (10;
- mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1);
- at least one of said mounting flanges (13, 14, 31, 31') includes a wide plate for the mounting of connector sockets, and wherein said wide plate includes a removable, at least partially flat section (33).

13. For use with a housing (1) adapted for receiving electrical assemblies (3) in the housing interior and between opposite housing side walls, an enclosure forming a rear wall for said housing (1), said enclosure comprising:
- a hollow body (10) including hollow body walls defining an inner space (11) therein;
- a power pack (12) for supplying power to said electrical assemblies (3);
- means (18) for mounting said power pack in said hollow body inner space (11) to enable heat to be carried out towards the outside of said housing (1);
- mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project form the housing (1);
- said hollow body (10) being provided, at least over one portion of the housing width, with a bus bar (22), including connecting clamps (25), the connecting clamps (25) projecting into the housing (1) at regular intervals and being connected with the power pack (12).

14. For use with a housing (1) adapted for receiving electrical assemblies (3) in the housing interior and between opposite housing side walls, an enclosure forming a rear wall for said housing (1), said enclosure comprising:
- a hollow body (10) including hollow body walls defining an inner space (1) therein;
- a power pack (12) for supplying power to said electrical assemblies (3);
- means (18) for mounting said power pack in said hollow body inner space (11) to enable heat to be carried off towards the outside of said housing (1);

mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project form the housing (1);

said hollow body (10) including a ventilator (35) and vent openings (29, 29,) for forced ventilation cooling of the power pack (12), and ventilator (35') and vent openings (29'', 29''') are provided for the ventilation of the housing inner space, wherein the ventilator (35) for forced ventilation cooling of the power pack (12) is in heat transfer connection with the housing inner space and wherein the ventilator (35') for ventilation the housing inner space is in heat transfer connection with the hollow body inner space (11) provided by a corresponding arrangement of air intake ad air outlet vent openings (29, 29', 29'', 29''') in the hollow body (10).

15. For use with a housing (1) adapted for receiving electrical assemblies (3) in the housing interior and between opposite housing side walls, an enclosure forming a rear wall for said housing (1), said enclosure comprising:

a hollow body (10) including hollow body walls defining an inner space (11) therein;

a power pack (12) for supplying power to said electrical assemblies (3);

means (18) for mounting said power pack in said hollow body inner space (11) to enable heat to be carried off towards the outside of said housing (1);

mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1);

said hollow body (10) including a ventilator (35) and vent openings (29, 29') for forced ventilation cooling of the power pack (12), and a ventilator (35') for ventilating the housing inner space, wherein the hollow body inner space (11) is subdivided by a partition wall (36) into an outer section (11') for receiving the power pack (12), and an inner section (11''), the partition wall (36), including heat exchanger means enabling heat transfer between the outer section (11') and the inner section (11'').

16. For use with a housing (1) adapted for receiving electrical assemblies (3) in the housing interior and between opposite housing side walls, an enclosure forming a rear wall for said housing (1), said enclosure comprising:

a hollow body (10) including hollow body walls defining an inner space (11) therein;

a power pack (12) for supplying power to said electrical assemblies (3);

means (18) for mounting said power pack in said hollow body inner space (11) to enable heat to be carried off towards the outside of said housing (1);

mounting means (13, 14) for mounting said hollow body (10) to one end of said housing (1) to enable one of said hollow body walls to form a rear wall for said housing (1), including an upper and a lower mounting flange (13, 14) located on said hollow body (10) to positionally locate said one of said hollow body walls forming said rear wall for said housing (1) within said housing interior and so that the hollow body (10) extends outwardly from said formed rear wall for said housing (1) to at least partially project from the housing (1);

said hollow body (10, 10', 10'') being formed as an extrusion profile.

* * * * *

UNITED STATES PATENT AND TRADEMARK OFFICE
CERTIFICATE OF CORRECTION

PATENT NO. : 4,864,468

DATED : September 5, 1989

INVENTOR(S) : HARALD WEISS

It is certified that error appears in the above-identified patent and that said Letters Patent is hereby corrected as shown below:

Col. 1, line 5, change "This relates" to --This invention relates--.

Col. 2, line 35, change "there is provide" to --there is provided--.

Col. 5, line 4, change "topped" to --tapped--.

Col. 6, line 33, change "capacitomer" to --capacitances--.

Col. 9, line 61, after "body" insert --(10) to one end of said housing (1) to form a rear wall for said--.

Col. 10, line 13, change "atone" to --at one--.

Col. 12, line 12, change "housing (10;" to --housing (1);--.

Col. 12, line 39, change "carried out" to --carried off--.

UNITED STATES PATENT AND TRADEMARK OFFICE
CERTIFICATE OF CORRECTION

PATENT NO. : 4,864,468

DATED : September 5, 1989

INVENTOR(S) : Harald Weiss

It is certified that error appears in the above-identified patent and that said Letters Patent is hereby corrected as shown below:

Col. 12, Line 63, change "inner space (1)" to --inner space (11)--.

Col. 13, Line 20, change "ventilation" to --ventilating--.

Col. 13, Line 23, change "intake ad" to --intake and--.

Signed and Sealed this

Twenty-sixth Day of March, 1991

Attest:

HARRY F. MANBECK, JR.

Attesting Officer     Commissioner of Patents and Trademarks